(12) United States Patent
Weber et al.

(10) Patent No.: US 12,327,700 B2
(45) Date of Patent: Jun. 10, 2025

(54) COMPOSITE PANEL WITH A SENSOR ASSEMBLY ON BOTH SIDES

(71) Applicant: SAINT-GOBAIN GLASS FRANCE, Courbevoie (FR)

(72) Inventors: Patrick Weber, Alsdorf (DE); Michael Zeiss, Heinsberg-Haaren (DE); Christian Effertz, Aachen (DE); Gabor Varga, Herzogenrath (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 518 days.

(21) Appl. No.: 17/634,831

(22) PCT Filed: Jul. 21, 2020

(86) PCT No.: PCT/EP2020/070505
§ 371 (c)(1),
(2) Date: Feb. 11, 2022

(87) PCT Pub. No.: WO2021/028163
PCT Pub. Date: Feb. 18, 2021

(65) Prior Publication Data
US 2022/0301793 A1   Sep. 22, 2022

(30) Foreign Application Priority Data
Aug. 13, 2019  (EP) .................... 19191457

(51) Int. Cl.
*H01H 36/00* (2006.01)
*C03C 4/16* (2006.01)

(52) U.S. Cl.
CPC .............. *H01H 36/00* (2013.01); *C03C 4/16* (2013.01); *H01H 2209/084* (2013.01); *H01H 2239/006* (2013.01); *H01H 2239/074* (2013.01)

(58) Field of Classification Search
CPC ......... B32B 17/10119; B32B 17/10724; B32B 17/10743; B32B 17/10752;
(Continued)

(56) References Cited

U.S. PATENT DOCUMENTS

| | | | | |
|---|---|---|---|---|
| 10,485,094 B1* | 11/2019 | Isohätälä | .............. | H05K 3/0014 |
| 2008/0158183 A1* | 7/2008 | Hotelling | ............ | G06F 3/04164 |
| | | | | 345/173 |

(Continued)

FOREIGN PATENT DOCUMENTS

| | | |
|---|---|---|
| DE | 10 2008 043610 A1 | 5/2010 |
| EP | 1 686 026 A1 | 8/2006 |

(Continued)

OTHER PUBLICATIONS

Machine translation of WO 2018/215106 via EPO (Year: 2018).*
(Continued)

*Primary Examiner* — Ian A Rummel
*Assistant Examiner* — Rebecca L Grusby
(74) *Attorney, Agent, or Firm* — Pillsbury Winthrop Shaw Pittman LLP

(57) ABSTRACT

A composite panel includes first and second substrate layers, first and second patterned electrically conductive layers, and an insulating layer. A first capacitive sensing element with a first supply line structure is formed in the first electrically conductive layer and a second capacitive sensing element with a second supply line structure is formed in the second electrically conductive layer. The first and second patterned electrically conductive layers are separated from one another by the insulating layer. The assembly composed of the first and second patterned electrically conductive layers and the insulating layer is arranged between the first and second substrate layers. The first and second capacitive sensing elements are arranged offset relative to each other. An (Continued)

Figure 1:
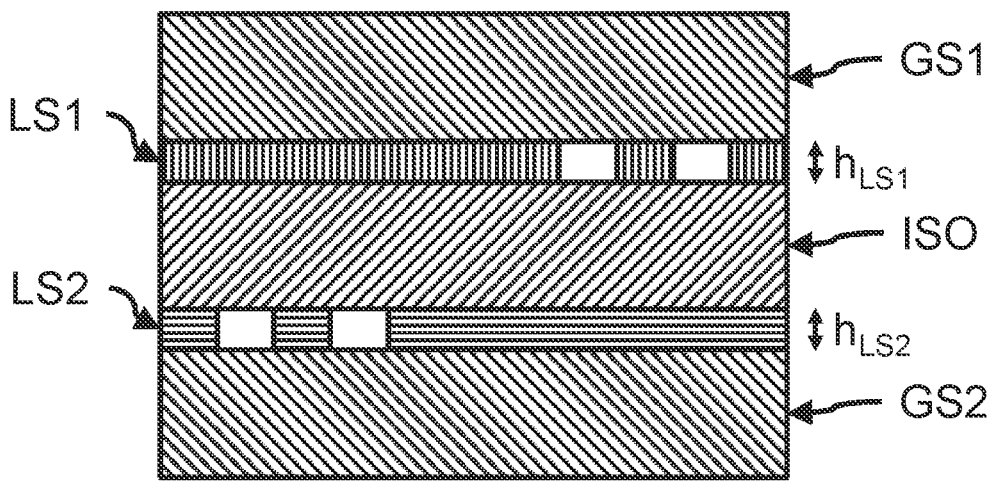

overlap of elements of the first capacitive sensitive element and of the first supply line structure makes up an area less than or equal to 10% of that of the second capacitive sensitive element.

12 Claims, 3 Drawing Sheets

(58) Field of Classification Search
CPC .......... B32B 17/10761; B32B 17/1077; B32B 17/10779; B32B 17/10036; B32B 17/1055; B60S 1/0825; B60S 1/0877; H01H 2339/006; H01H 2339/074; H03K 17/962; H03K 2217/960765
See application file for complete search history.

(56) References Cited

U.S. PATENT DOCUMENTS

| | | | | |
|---|---|---|---|---|
| 2009/0039901 | A1* | 2/2009 | Delatte | G01N 27/223 324/664 |
| 2010/0179725 | A1* | 7/2010 | Boote | H03K 17/962 200/600 |
| 2011/0193574 | A1* | 8/2011 | De Boer | G01D 5/2417 324/688 |
| 2020/0156351 | A1* | 5/2020 | Weber | B32B 17/10293 |

FOREIGN PATENT DOCUMENTS

| | | |
|---|---|---|
| EP | 3 264 241 A1 | 1/2018 |
| EP | 3 264 242 A1 | 1/2018 |
| GB | 1042331 A | 9/1966 |
| TW | 201349058 A * | 12/2013 |
| WO | WO 2014/037016 A1 | 3/2014 |
| WO | WO 2016/116372 A1 | 7/2016 |
| WO | WO 2018/215106 A1 | 11/2018 |

OTHER PUBLICATIONS

Machine translation of TW 201349058 via EPO (Year: 2013).*
Machine translation of DE 102008043610 via EPO (Year: 2010).*
International Search Report as issued in International Patent Application No. PCT/EP2020/070505, dated Sep. 29, 2020.
Search Report as issued in Chinese Patent Application No. 202080002108.8, dated Sep. 28, 2022.

* cited by examiner

COMPOSITE PANEL WITH A SENSOR ASSEMBLY ON BOTH SIDES

CROSS-REFERENCE TO RELATED APPLICATIONS

This application is the U.S. National Stage of PCT/EP2020/070505, filed Jul. 21, 2020, which in turn claims priority to European patent application number 19 191 457.1 filed Aug. 13, 2019. The content of these applications are incorporated herein by reference in their entireties.

The invention relates to a composite panel with a sensor assembly on both sides.

From the European patent application EP 3 264 242 A1, it is known to integrate a touch sensor as a switching element with a light display in a glass panel. A similar assembly is known from the European patent application EP 3 264 241 A1.

An assembly of two touch sensors positioned in proximity to one another is known from the international patent application WO 2016/116 372 A1.

Capacitive touch sensors have the property of being unable to distinguish the side from which the touch sensor is actuated without further measures.

Known from WO 2018/215 106 A1 are a touch sensor and a rain sensor that are positioned asymmetrically by respective different relative positioning, i.e., one sensor is, in each case, closer to a different panel surface.

This is possible only by arranging the touch sensor closer to one surface of the pane than to the other surface. Here, "closeness" is understood to refer to the distance in the normal direction to the surface extension of the capacitive sensing region.

However, in order to avoid erroneous operation, the sensor must then be evaluated intensively to such an extent that a capacitive influence from the "undesired" side does not result in successful switching. However, as a rule, this also reduces the area in which a capacitive influence from the "desired" side results in successful switching.

In order to counteract this limitation, it has, consequently, been proposed in the past to introduce shielding such that a capacitive influence from the "undesired" side is shielded and thus does not result in successful switching.

However, if two touch sensors on different sides are required, either a laterally offset arrangement of the touch sensors is necessary or, due to the design, there is a relatively thick assembly composed of an electrically conductive layer with the first touch sensor, an insulating layer, and a subsequent shielding layer, whereupon another insulating layer toward a second electrically conductive layer with the second touch sensor was then required.

The side-by-side arrangement of sensors is space-consuming and results in a reduction of the optically usable area. Both practical and normative limits must be accommodated here such that a side-by-side arrangement is not always possible. In addition, it would often be desirable to provide the connections to other electrical systems in a concentrated manner, instead of a distributed manner.

However, if touch sensors are stacked in the known manner, the problem often arises that composite panels become too thick. With increasing thicknesses, composite glass panels also become heavier. Both are undesirable phenomena since, for example, insertion widths often must not exceed a certain dimension or there is a requirement to keep weight low, e.g., in vehicles, such that the payload can be kept high or less drive energy is required for locomotion.

Based on this, the object of the invention is to provide an improved composite glass panel in which one or more problems from the prior art are avoided.

The object is accomplished by a composite panel with a sensor assembly on both sides, comprising a first substrate layer and a second substrate layer, a first patterned electrically conductive layer and a second patterned electrically conductive layer, as well as an insulating layer, wherein a first capacitive sensing element with a first supply line structure is formed in the first electrically conductive layer and a second capacitive sensing element with a second supply line structure is formed in the second electrically conductive layer, wherein the first patterned electrically conductive layer and the second patterned electrically conductive layer are separated from one another at least by the insulating layer, wherein the assembly composed of the first patterned electrically conductive layer, the second patterned electrically conductive layer, and the insulating layer is arranged between the first substrate layer and the second substrate layer, wherein the first capacitive sensing element is arranged offset relative to the second capacitive sensing element such that at least parts of the first patterned electrically conductive layer form a shielding for the second capacitive sensing element and at least parts of the second patterned electrically conductive layer form a shielding for the first capacitive sensing element.

A overlap of elements of the first capacitive sensitive element and the first supply line pattern makes up an area less than or equal to 10% of the surface area of the second capacitive sensitive element.

This has the advantage of providing, in a narrow space, two touch sensors with an effective area on different sides of a composite glass panel, requiring only a few layers but, nevertheless, providing decoupling of the touch sensors such that the touch sensors can be designed to be sensitive.

In other words, parts of the sensors can overlap. With a small overlap, the capacitive influence from the "undesired" side is so small that the sensitivity is not permanently impaired on the "desired" side.

In another embodiment of the invention, the first patterned electrically conductive layer and/or the second patterned electrically conductive layer has a height of 10 µm-75 µm, in particular 35 µm, or particularly preferably 50 µm.

This enables a thin assembly that can also be integrated into a composite panel or that can also be adapted to a curved surface.

In yet another embodiment of the invention, the first patterned electrically conductive layer and/or the second patterned electrically conductive layer comprises copper, tin, silver, indium tin oxide, gold, graphemes, and/or mixtures thereof.

In other words, the invention can be readily and economically incorporated into existing processes.

According to another embodiment of the invention, the insulating layer is a film.

In other words, the invention can be readily and economically incorporated into existing processes.

According to yet another embodiment of the invention, the insulating layer is a film and the first patterned electrically conductive layer and/or the second patterned electrically conductive layer is/are applied on the film.

As a result, the film F can be provided prefabricated with one or two patterned electrically conductive layers for introduction into a composite glass panel.

In one embodiment of the invention, the first substrate layer and/or the second substrate layer is a glass or plastic substrate.

In yet another embodiment of the invention, the first substrate layer and/or the second substrate layer is selected from a group comprising flat glass, float glass, quartz glass, borosilicate glass, soda lime glass, polyethylene, polypropylene, polycarbonate, polymethyl methacrylate, polystyrene, polyarnide, polyester, polyvinyl chloride, and/or mixtures thereof.

In other words, the invention can be readily and economically incorporated into existing processes.

According to another embodiment of the invention, the insulating layer comprises at least one material selected from the group comprising polyimide, polyurethane, polymethyl methacrylic acid, polycarbonate, polyethylene terephthalate, polyvinyl butyral, FRS, acrylonitrile butadiene styrene copolymer, polyethylene, polypropylene, polyvinyl chloride, polystyrene, polybutylene terephthalate, polyamide.

In embodiments of the invention, the composite glass panel according to the invention can be used as a vehicle pane or as part of a building glazing or in a display.

In the following, the invention is explained in more detail with reference to drawings and exemplary embodiments. The drawings are schematic representations and not-to-scale. The drawings in no way restrict the invention.

Figure 2:
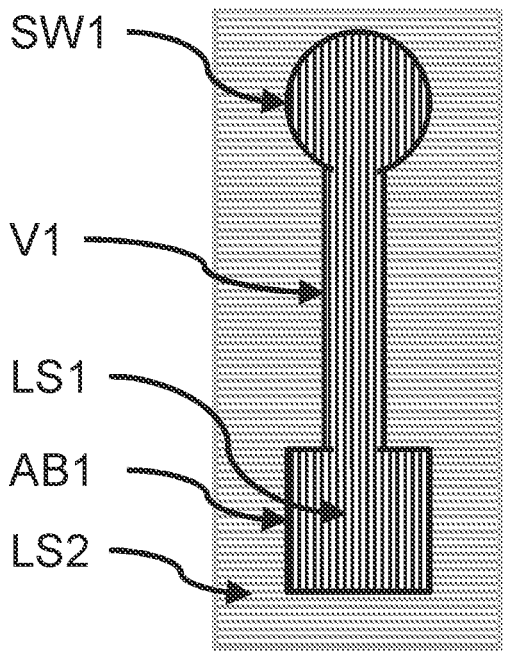
Figure 3:
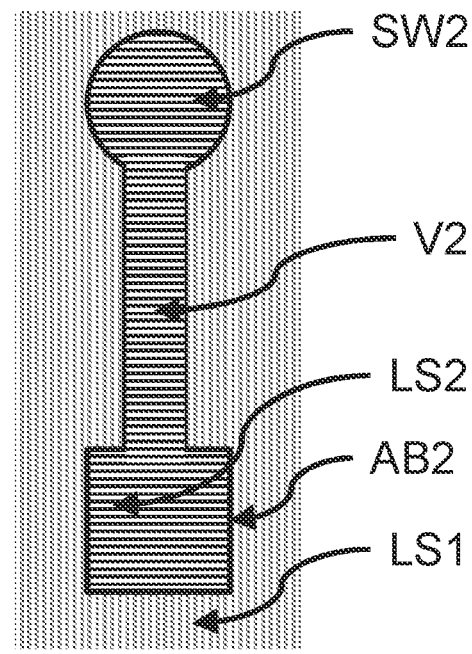
Figure 4:
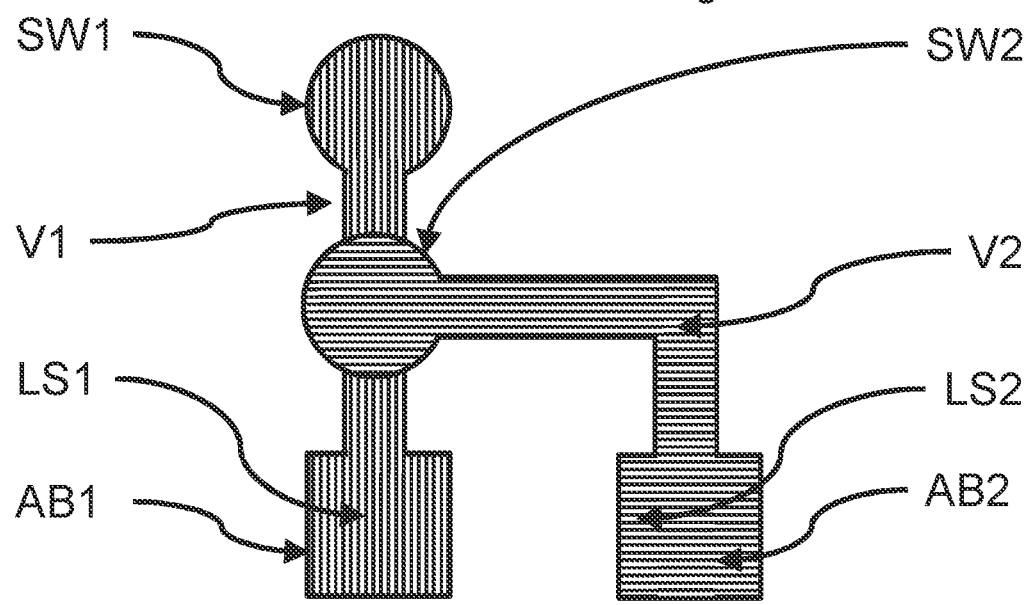
Figure 5:
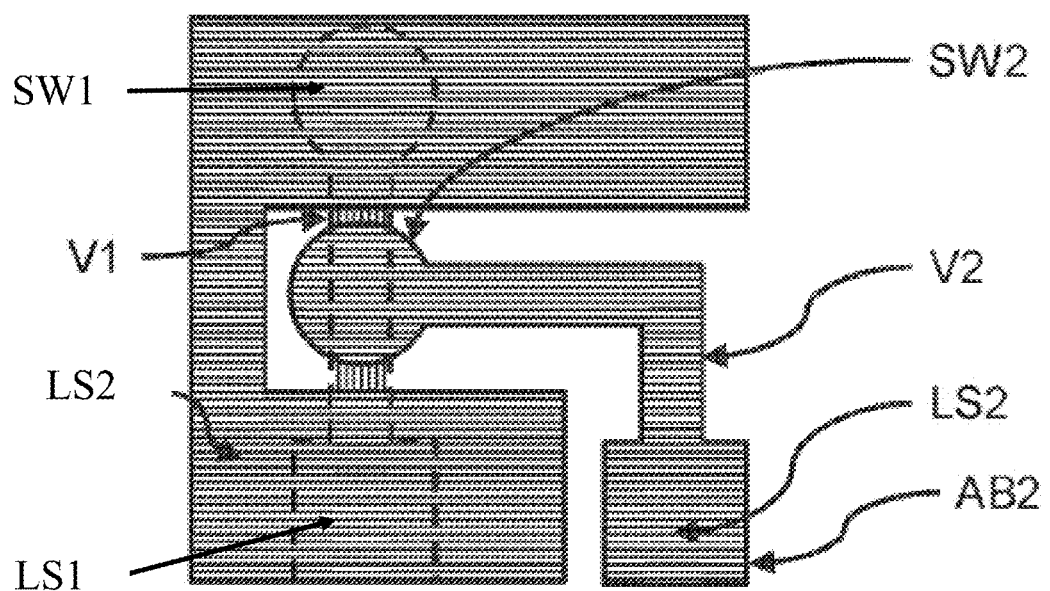

They depict:

FIG. 1 a schematic overview regarding the arrangement of films, substrate layer(s) to illustrate aspects according to the invention, FIG. 2 a schematic plan view of electrically conductive layers, wherein the first electrically conductive layer is arranged on a top side, FIG. 3 a schematic plan view of electrically conductive layers, wherein the second electrically conductive layer is arranged on a top side, FIG. 4 a schematic view of the parts acting as touch sensors, with the shielding parts omitted, wherein the second electrically conductive layer is arranged on a top side, and FIG. 5 a schematic view of the parts acting as touch sensors, with shielding parts, wherein the second electrically conductive layer is arranged on a top side.

In the following, the invention will be presented in greater detail with reference to the figures. It should be noted that different aspects are described, each of which can be used individually or in combination. In other words, any aspect can be used with different embodiments of the invention unless presented as a pure alternative.

Also, in the following, for the sake of simplicity, reference is generally always made to only one entity. However, unless explicitly noted, the invention can in each case also have a plurality of the entities in question. Thus, the use of the words "a" and "an" is to be construed only as an indication that at least one entity is used in a simple embodiment.

When, in the following, methods are described, the individual steps of a method can be arranged in any order and/or combined provided the context does not explicitly indicate otherwise. Furthermore, the methods can be combined with each other—unless expressly indicated otherwise.

Specifications with numerical values are generally to be understood not as exact values, but also include a tolerance of from ±1% up to ±10%.

Insofar as standards, specifications, or the like are mentioned in this application, reference is always made at least to the standards, specifications, or the like applicable on the date of filing. In other words, if a standard/specification, etc. is updated or superseded, the invention is also applicable thereto.

Various embodiments are presented in the figures. In the following, "touch sensor" shall be understood in the context of the "capacitive proximity sensor". In other words, as a rule no touch is required to influence the capacitance, but rather an approach. The switching surface of the touch sensor forms a surface electrode. The capacitance of the surface electrode is measured by capacitive sensor electronics. The capacitance of the surface electrode changes against ground when a grounded body comes into its vicinity or, for example, touches an insulating layer above the surface electrode. The insulating layer can be formed, for example, by a substrate GS1, GS2. The change in capacitance is measured by the sensor electronics, and a switching signal is triggered when a threshold value is exceeded. The switching region is determined by the shape and size of the surface electrode.

FIG. 1 depicts a schematic overview regarding the arrangement of films, substrate layer(s) to illustrate aspects according to the invention.

A composite panel 1 with a sensor assembly on both sides is depicted in a schematic section.

The composite panel 1 has a first substrate layer GS1 and a second substrate layer GS2.

Furthermore, the composite panel 1 has a first patterned electrically conductive layer LS1 and a second patterned electrically conductive layer LS2 as well as an insulating layer ISO.

A first capacitive sensing element SW1 with a first supply line structure V1 is formed in the first electrically conductive layer LS1. The first capacitive sensing element SW1 can, for example, be designed such that it corresponds in size to an average fingertip size.

The first capacitive sensing element SW1 preferably has an area of 1 $cm^2$ to 200 $cm^2$, particularly preferably of 1 $cm^2$ to 10 $cm^2$. The first capacitive sensing element SW1 can, for example, have the shape of an oval, an ellipse, or a circle, a triangle, a rectangle, a square, or another type of quadrilateral or a higher polygon. In particular, circular, elliptical, or teardrop shapes or shapes with rounded corners and strip shapes are particularly advantageous.

Optionally, in addition, an enlarged connection region AB1 (enlarged compared to the supply line structure V1) can be formed, in order, for example, to facilitate contacting to other electrical devices.

A second capacitive sensing element SW2 with a second supply line structure V2 is formed in the second electrically conductive layer LS2. The second capacitive sensing element SW2 can, for example, be designed such that it likewise corresponds in its size to an average fingertip size. The second capacitive sensing element SW2 preferably has an area of 1 $cm^2$ to 200 $cm^2$, particularly preferably of 1 $cm^2$ to 10 $cm^2$. The second capacitive sensing element SW2 can, for example, have the shape of an oval, an ellipse, or a circle, a triangle, a rectangle, a square, or another type of quadrilateral or a higher polygon. In particular, circular, elliptical, or teardrop shapes or shapes with rounded corners and strip shapes are particularly advantageous.

The first patterned electrically conductive layer LS1 and the second patterned electrically conductive layer LS2 are separated from one another at least by the insulating layer ISO.

The assembly composed of the first patterned electrically conductive layer LS1, the second patterned electrically conductive layer LS2, and the insulating layer ISO is arranged between the first substrate layer GS1 and the second substrate layer GS2.

The first capacitive sensing element SW1 is offset relative to the second capacitive sensing element SW2 in its spatially planar extension such that at least parts of the first patterned electrically conductive layer LS1 form a shielding for the second capacitive sensing element SW2 and at least parts of the second patterned electrically conductive layer L2 form a shielding for the first capacitive sensing element SW1.

In other words, at least parts of the first patterned electrically conductive layer LS1, which are not part of the first capacitive sensing element SW1, form a shielding for the second capacitive sensing element SW2. At least parts of the second patterned electrically conductive layer LS2, which are not part of the second capacitive sensitive element SW2, form a shielding for the first capacitive sensing element SW1.

This has the advantage of providing, in a narrow space, two touch sensors with an effective area on different sides of a composite glass panel, requiring only a few layers but, nevertheless, providing decoupling of the touch sensors such that the touch sensors can be designed to be sensitive.

Thus, touch sensors can be provided in a small space. In other words, in a limited region that is available for such touch sensors, touch sensors can now be provided on both sides of the composite panel 1 such that, in a favorable case, there can be a doubling of the number of touch sensors in a limited area.

In addition, the thickness of a composite panel 1 can be kept low since no more layers are required than with a sensor assembly on one side. As a result, weight can be saved and previous insertion widths can also be retained.

FIG. 2 depicts a schematic plan view of the first electrically conductive layer LS1, under which a part of the second electrically conductive layer LS2 is situated. It can be seen that the part of the second electrically conductive layer LS2 situated under the first capacitive sensing element SW1 serves as shielding. In addition, provision can also be made for the first supply line structure V1 (shown distortedly enlarged) and/or also an optional associated connection region AB1 (shown distortedly enlarged) to likewise be shielded by a part of the second electrically conductive layer LS2.

FIG. 3 depicts a similar schematic plan view of the second electrically conductive layer LS2, under which a part of the first electrically conductive layer LS1 is situated. It can be seen that the part of the first electrically conductive layer LS1 situated under the second capacitive sensing element SW2 serves as shielding. In addition, provision can also be made for the second supply line structure V2 (shown distortedly enlarged) and/or also an optional associated connection region AB2 (shown distortedly enlarged) to likewise be shielded by a part of the first electrically conductive layer LS1.

Here, the more shielding there is, the less influence can be exerted on the touch sensor from the "undesired" side. Since the supply line structures can be kept rather narrow—in the figures, the patterneds are exaggerated for clarity—an influence exerted is less significant than an influence exerted on a capacitive sensing element. In addition, as a rule, an intentional influence is to be expected neither at the location of the supply line structure nor at the location of an optional connection region.

In other words, by suitable dimensioning, the installation space can be well utilized for a large number of sensors, while providing a high degree of (mutual) shielding.

Since the electrically conductive structure of the switching surface only has to transport low currents, higher sheet resistance of the layer can be selected. An advantageous electrically conductive layer LS1 and LS2 according to the invention has sheet resistance of 0.4 ohm/square to 200 ohm/square.

The switching surface can be electrically connected, in particular galvanically, capacitively, and/or inductively to sensor electronics. The sensor electronics can be arranged external to the composite panel 1 or within or on the composite panel 1.

In the embodiments of the invention, the overlap of elements of the first capacitive sensitive element SW1 and of first supply line structure V1 is preferably less than or equal to 10% of the surface area of the second capacitive sensitive element SW2, In other words, capacitively influenceable regions of the first capacitive element SW1 including its supply line structure V1 overlap less than $\frac{1}{10}$ of the surface area of the second capacitive sensitive element SW2. This keeps the possible capacitive influence of the first capacitive sensitive element SW1 small compared to the second capacitive sensing element SW2. In other words, despite overlapping, sensitivity can be provided without causing erroneous operations. This enables freer placement of the touch sensors.

According to another embodiment of the invention, the first patterned electrically conductive layer LS1 has—as depicted in FIG. 1—a height (also referred to as thickness of the layer) $h_{LS1}$ of 10 µm-75 µm. A second patterned electrically conductive layer LS2 can also be provided. This second conductive layer LS2 can also have a height (also referred to as thickness of the layer) $h_{LS2}$ of 10 µm-75 µm. Preferably, the first electrically conductive layer and the second electrically conductive layer have a height of approx. 35 µm and 50 µm, respectively. Optionally, an adhesion promoting layer can be applied on the first electrically conductive layer and/or on the second electrically conductive layer. This adhesion promoting layer can, for example, have a height of approx. 15 µm in each case.

This makes possible a thin assembly that can also be integrated into a composite panel 1 or that can also be adapted to a curved surface.

According to yet another embodiment of the invention, the first patterned electrically conductive layer LS1 and/or the second patterned electrically conductive layer LS2 comprise copper, tin, silver, indium tin oxide, gold, graphenes, and/or mixtures thereof.

In other words, the invention can be readily and economically incorporated into existing processes.

It should be noted that the conductor layers LS1, LS2 can comprise different materials. However, they preferably comprise the same materials. In other words, the conductor structures can be adapted to electrical and/or thermal and/or mechanical boundary conditions.

It should be noted that other electrical functions can be implemented in the first patterned electrical layer LS1 and/or in the second electrically patterned layer LS2. For example, display elements and/or antennas and/or heating elements and/or other functional elements can be implemented.

In another embodiment of the invention, the insulating layer ISO is a film.

In other words, the invention can be readily and economically incorporated into existing processes.

In particular, for example, for production, provision can be made for the first electrically conductive layer LS1 and/or the second electrically conductive layer LS2 to be provided on the film.

As a result, the film F can be provided prefabricated with one or two patterned electrically conductive layers for introduction into a composite glass panel.

In other words, the patterning for the formation of touch sensors can be provided on an electrically conductive layer by suitable measures. In addition to the selective application of a patterned electrically conductive layer, e.g., by means of a printing process (screen-printing, etc.), it is alternatively or additionally possible to provide patterns by ablative processes, such as laser patterning, peeling, milling, cutting, etc.

The width of the separation lines, which are depicted in FIG. 1 as white fields, is preferably from 30 μm to 200 μm and particularly preferably from 70 μm to 140 μm. Such thin separation lines allow reliable and sufficiently high electrical insulation and, at the same time, do not or only slightly interfere with vision through the composite panel 1. The separation lines are preferably produced by laser patterning or chemical or mechanical ablation. Such an arrangement of switching surfaces is particularly simple and economical to produce.

The separation lines can remain exposed or be filled with an insulating material.

Without limiting the generality of the invention, the first electrically conductive layer LS1 and/or the second electrically conductive layer LS2 can also be provided on an adjacent substrate GS1/GS2 in each case.

In other words, the patterning for formation of touch sensors can be provided on an electrically conductive layer by suitable measures. In addition to the selective application of a patterned electrically conductive layer, e.g., by means of a printing method (screen-printing, etc.), it is alternatively or additionally possible to provide patterns by ablative processes, such as laser patterning, peeling, milling, cutting, etc.

The first substrate layer GS1 and/or the second substrate layer GS2 can, for example, be a glass of or a plastic substrate. In principle, all electrically insulating substrates that are thermally and chemically stable under the conditions of production and use of the vehicle pane according to the invention are suitable as the substrate.

With regard to FIGS. 2 and 3, when viewed together, a side-by-side arrangement the touch sensors in close proximity can be seen.

FIG. 4 shows an overlap, in which, initially, only the parts acting as touch sensors are shown, omitting the shielding parts, with the second electrically conductive layer arranged on a top side. For comparison, FIG. 5 shows, from the same viewing direction, a schematic view of the parts acting as touch sensors with shielding parts, wherein the second electrically conductive layer is arranged on a top side. As can clearly be seen, here, the second capacitive sensing element SW2 is arranged above the first supply line structure V1. To avoid capacitive coupling, the first supply line structure V1 and the second supply line structure V2 are without overlap. If the area of the supply line structures is small compared to the surface area of the capacitive sensitive element SW1/SW2, a partial or complete overlap can also be enabled. The same applies to optional connection regions AB1, AB2. It is, however, desirable for the outer regions of a capacitive sensitive element to be substantially shielded.

The first substrate layer GS1 and/or the second substrate layer GS2 particularly preferably contains flat glass, float glass, quartz glass, borosilicate glass, soda lime glass or clear plastics, preferably rigid clear plastics, in particular polyethylene, polypropylene, polycarbonate, polymethyl methacrylate, polystyrene, polyamide, polyester, polyvinyl chloride, and/or mixtures thereof.

In other words, the invention can even be particularly simply integrated into existing material systems.

In another embodiment of the invention, the insulating layer ISO has at least one material selected from the group comprising polyimide, polyurethane, polymethyl methacrylic acid, polycarbonate, polyethylene terephthalate, polyvinyl butyral, FR6, acrylonitrile butadiene styrene copolymer, polyethylene, polypropylene, polyvinyl chloride, polystyrene, polybutylene terephthalate, polyamide.

In other words, the invention can even be particularly simply integrated into existing material systems.

In embodiments of the invention, the composite panel according to the invention can be used as a vehicle pane, or as part of a building glazing or in a display Without limiting generality, the composite pan& can be a windshield, a rear window, a side window, or a roof panel.

According to another embodiment of the invention, a vehicle, in particular a land, water, air, or space craft, is provided having a composite panel according to the invention.

In particular, in the case of public transportation vehicles, such as buses and trains, two-sided switching elements are found in the glass area. Such switching elements are used, for example, to control doors such that they can be opened from both inside and outside.

LIST OF REFERENCE CHARACTERS 1 composite panel
GS1 first substrate layer
GS2 second substrate layer
LS1 first patterned electrically conductive layer
LS2 second patterned electrically conductive layer
ISO insulating layer
SW1 first capacitive sensing element
V1 first supply line structure
SW2 second capacitive sensing element
V2 second supply line structure
AB1 connection region
AB2 connection region
$h_{LS1}$ height of the first patterned electrically conductive layer
$h_{LS2}$ height of the second patterned electrically conductive layer

The invention claimed is:

1. A composite panel with a sensor assembly on both sides, comprising a first substrate layer and a second substrate layer, a first patterned electrically conductive layer and a second patterned electrically conductive layer, as well as an insulating layer, wherein a first capacitive sensing element with a first supply line structure is formed in the first electrically conductive layer and a second capacitive sensing element with a second supply line structure is formed in the second electrically conductive layer,
    wherein the first patterned electrically conductive layer and the second patterned electrically conductive layer are separated from one another at least by the insulating layer,
    wherein an assembly composed of the first patterned electrically conductive layer, the second patterned electrically conductive layer, and the insulating layer is arranged between the first substrate layer and the second substrate layer,
    wherein the first capacitive sensing element is arranged offset relative to the second capacitive sensing element such that at least parts of the first patterned electrically conductive layer form a shielding for the second capacitive sensing element and at least parts of the second patterned electrically conductive layer form a shielding for the first capacitive sensing element, wherein an overlap of elements of the first capacitive sensing element and of the first supply line structure makes up an area less than or equal to 10% of a surface area of the second capacitive sensing element.

2. The composite panel according to claim 1, wherein the first patterned electrically conductive layer and/or the second patterned electrically conductive layer has a height of 10 µm-75 µm.

3. The composite panel according to claim 1, wherein the first patterned electrically conductive layer and/or the second patterned electrically conductive layer has a height of 50 µm.

4. The composite panel according to claim 1, wherein the first patterned electrically conductive layer and/or the second patterned electrically conductive layer comprises copper, tin, silver, indium tin oxide, gold, graphenes, and/or mixtures thereof.

5. The composite panel according to claim 1, wherein the insulating layer is a film.

6. The composite panel according to claim 1, wherein the insulating layer is a film and wherein the first patterned electrically conductive layer and/or the second patterned electrically conductive layer are applied on the film.

7. The composite panel according to claim 1, wherein the first substrate layer and/or the second substrate layer are/is a glass or plastic substrate.

8. The composite panel according to claim 1, wherein the first substrate layer and/or the second substrate layer are/is selected from the group comprising consisting of flat glass, float glass, quartz glass, borosilicate glass, soda lime glass, polyethylene, polypropylene, polycarbonate, polymethyl methacrylate, polystyrene, polyamide, polyester, polyvinyl chloride, and/or mixtures thereof.

9. The composite panel according to claim 1, wherein the insulating layer comprises at least one material selected from the group consisting of polyimide, polyurethane, polymethyl methacrylic acid, polycarbonate, polyethylene terephthalate, polyvinyl butyral, acrylonitrile butadiene styrene copolymer, polyethylene, polypropylene, polyvinyl chloride, polystyrene, polybutylene terephthalate, polyamide.

10. A method comprising manufacturing a vehicle pane with a composite panel according to claim 1.

11. A method comprising manufacturing a building glazing with a composite panel according to claim 1.

12. The composite panel according to claim 1, wherein the first patterned electrically conductive layer is in direct contact with a first side of the insulating layer and the second patterned electrically conductive layer is in direct contact with a second side of the insulating layer, the first side of the insulating layer being opposite to the second side of the insulating layer.

* * * * *